United States Patent [19]

Chu et al.

[11] Patent Number: 4,519,091
[45] Date of Patent: May 21, 1985

[54] DATA CAPTURE IN AN UNINTERRUPTED COUNTER

[75] Inventors: David C. Chu, Woodside; Michael J. Ward, San Jose, both of Calif.

[73] Assignee: Hewlett-Packard Company, Palo Alto, Calif.

[21] Appl. No.: 519,953

[22] Filed: Aug. 3, 1983

[51] Int. Cl.³ .................... H03K 21/18; H03K 21/34; H03K 21/10
[52] U.S. Cl. ........................ 377/44; 377/30; 377/37
[58] Field of Search ............... 377/30, 37, 44

[56] References Cited

U.S. PATENT DOCUMENTS 3,605,025  9/1971  Lincoln et al. ............... 377/44
3,735,387  5/1973  Miller ............................ 377/30
3,863,153  1/1975  Eshraghian .................... 377/44
4,468,797  8/1984  Shin .............................. 377/44

Primary Examiner—John S. Heyman
Attorney, Agent, or Firm—Edward Y. Wong

[57] ABSTRACT

A method of sampling accurately the instantaneous content of a high speed counter without interrupting the counting process is provided. The method is applicable even when the higher order digits of the counter are constructed by slower switching circuits configured in either a synchronous or ripple-through arrangement. The switching and carry propagation times of these higher order counters need not be shorter than the time between successive events being counted. Sampling of the contents may be made repeatedly in the interim without affecting the totality of the final count.

7 Claims, 4 Drawing Figures

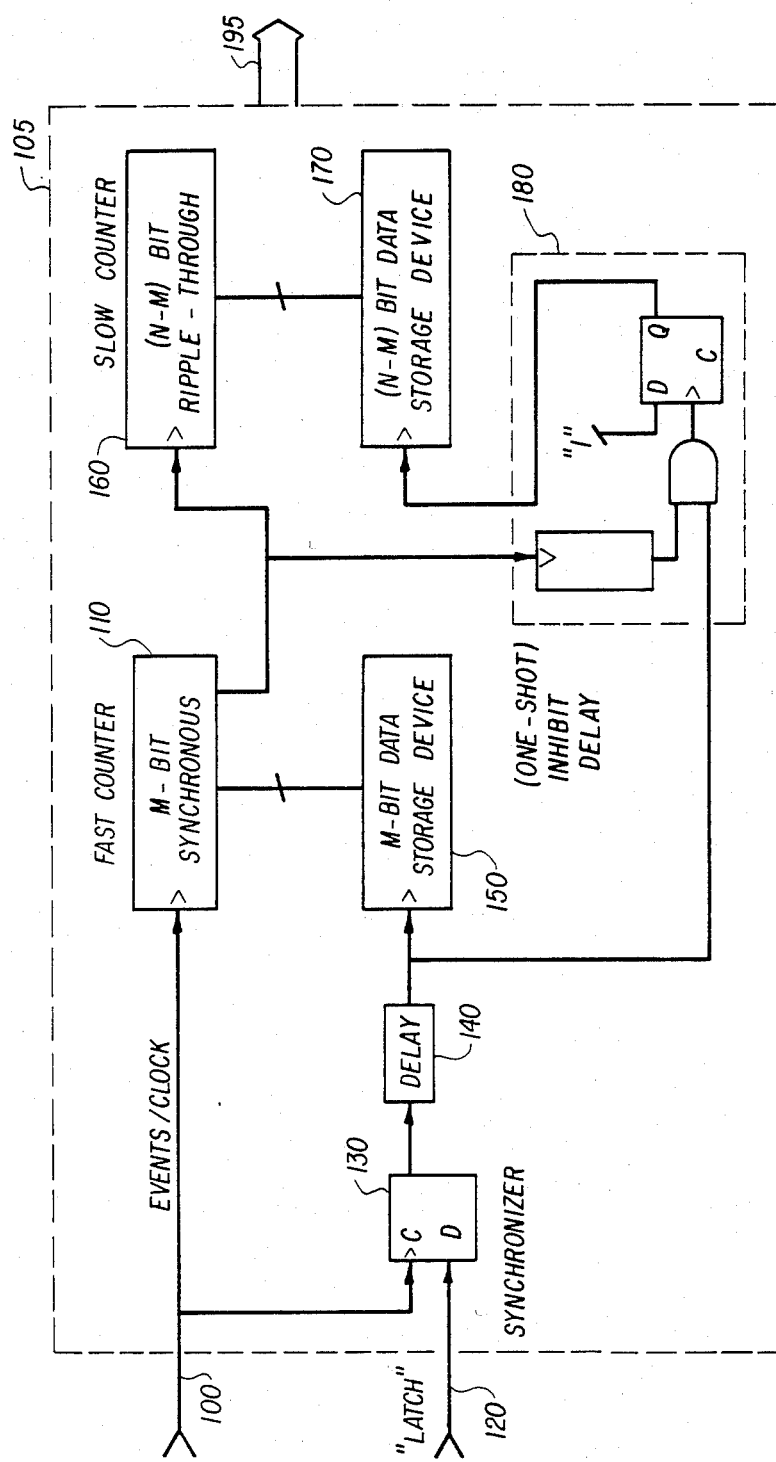
FIG. IA

DATA CAPTURE IN AN UNINTERRUPTED COUNTER

BACKGROUND OF THE INVENTION

Any circuit, system or method of counting events requires some means of making available to the external world its current data, that is, the number of events being counted. Such means, for example, can be a communications link or a data processor. Conventional techniques with such means require that the input events be disconnected temporarily from a counter during the time the readout is occurring; otherwise, the data will change in unpredictable ways during readout, thus leading to ambiguous and erroneous counts. For example, if an event arriving during readout should cause a carry bit to propagate through the counter, the apparent data may be erroneous. Since any bit in the count chain may be in transition while being read, such errors are not limited to the least significant count. Therefore, to avoid such errors and ambiguities, counting in the prior art is suspended for a duration, viz., a "dead time," to allow the count bits to settle before readout.

Dead time, however, in a counting system is undesirable for many reasons. One prime reason is that continuity and totality of the counting process is lost, since events are not being monitored during dead time. In other words, in such a system each measurement is separate from the others and is meaningful only from a start to the very next stop event. Furthermore, the ±1 count quantization ambiguities inherent in any counting process do not necessarily cancel from one measurement to the next. Thus, it is possible to have 100 measurements, each of which has a +1 ambiguity, and end up an accumulated error of +100, rather than a cancelled error after 100 measurements. In a continuous measurement, in contrast, such accumulations of quantization errors are avoided.

To avoid dead time, several approaches are used in the prior art counters. One approach is to use fully synchronized count chains. A synchronous counter requires that all elements in the chain be able to change state completely between two successive incoming events. For example, the switching speed of every bit in a synchronous binary chain should be as fast as that of the least significant bit. And since a carry bit must propagate through many bits in the count chain before all the bits can settle, the settling time then acts as a limit to the maximum frequency at which events can be counted, especially if the synchronous counter has a long synchronous chain.

Another approach to eliminating dead time in counting uses logic elements such as OR gates to detect the presence of a carry bit anywhere within the count chain, and to prohibit reading of data when a carry bit is detected. However, for high speed counting, timing delays caused by the carry bit and the logic elements may be many times greater than the time interval between two successive events, thus rendering the counting scheme unusuable. Therefore, such a scheme is restricted to relatively low-speed counting.

Yet another method to avoid dead time is to use two counters in syncopation. In this method, two counters are used for alternating functions: one counter is counting while the other counter is stopped and read. This method, while reducing dead time to virtually zero, suffers from visible accumulation of ±1 count quantization errors as in the separately gated counter case. In other words, the sum of counts from either counter may differ from the true count by more than ±1 count.

SUMMARY OF THE INVENTION

The method of counting events in accordance with the present invention avoids the problems associated with the prior art zero-dead-time counters. It allows high-speed, zero-dead-time counting and at the same time continuous and accurate access to true, current count data. This distinct advantage to the system in accordance with the preferred embodiment can be summarized as follows:

1. Counting is continuous; hence, incoming events need not be disconnected from the system to cause a dead time.

2. At the instant of a latch command, the correct count data is captured.

3. Less expensive, slower ripple-through counters may be used for higher stages in the count chain, where switching speed and carry propagation delays may be many times slower than the time between two successive count events.

4. Slowness of the propagation of the carry bits does not limit the maximum speed of event counting; it affects only the rate at which count data can be captured.

In a continuous count system in accordance with the preferred embodiment of the invention, all data obtained are derived from the same uninterrupted counting process. The data therefore are all interrelated and amenable to further digital filtering for more meaningful results. The data captured by the preferred embodiment may then be stored in memory for either real time processing or subsequent block filtering processing. Again because of the continuity in the counting process, true Allen variance frequency stability analyses of the data are possible. In other words, digital filtering of the data becomes practical, and statistical processing of the data for orders of magnitude in increase in resolution is possible.

Another advantage to the preferred embodiment is the ability to test interim data during the measurement process: In a given measurement, samples of the current count at various points during that period can be taken without affecting the final results of the measurement. These sample counts, however, can be used as interim data to be tested, or they can be used to modify the overall measurement already underway, or both.

In accordance with the preferred embodiment of the invention, events are counted by a high speed binary counter chain, such as a binary synchronous counter. The last or most significant bit of the fast counter chain is used as an input to another binary counter chain, a slower counter chain, such as a ripple-through counter. The two chains are thus in tandem to form, for example, a 32-bit counter chain. An externally generated latch command is synchronized with the advent of a next event to trigger a high speed latch, thus capturing the contents of the fast counter chain immediately. The contents of the slower counter, however, may be in transition and skewed in time, and hence cannot be latched immediately without causing errors. In the preferred embodiment a timing and delay circuit determines the proper time to latch and capture the contents of the slower counter. It does so by identifying a predetermined time interval after each pulse to the slow chain as an "unsafe" interval. If a latch command occurs during this unsafe interval, the circuit will delay the actual latching until the end of this interval. In this way, the latch signal always causes the correct and current content of the counters, both fast and slow, to be captured. Typically, the information so captured is stored in memory for later processing.

Specifically, in accordance with the preferred embodiment of the invention as shown in FIG. 1A, the events being counted is a signal at the clock input. It is a timebase clock with a very precise frequency. A latching command is derived from external events being measured. The time duration between latching commands is computed by subtracting two consecutive readings of the counter and then multiplying the resultant difference by the period of the timebase clock. In the case of a plurality of events, the duration between any two events is similarly obtained by subtraction of corresponding counter readings. The number of events within the interval divided by the computed time duration gives the frequency of occurrence of the events. In an alternate embodiment of the invention, external signal events activate the clock input (100) of the counter, and the latch command (120) is derived from a multiple M of the timebase clock as shown in FIG. 1B. The number of events occurring within a known time interval, $\Delta$ count, is obtained from subtracting two successive readings 195 of the counter. To obtain the frequency of the events, the events are divided by the known time period, that is, Frequency as measured between latches = $\Delta$ count/$MT_o$.

In a more sophisticated frequency measurement method, two continuous counters as shown in FIG. 1C are used. One of the continuous counters, counter E 105, is used to measure signal events, and the other, counter T 105', is used to measure timebase clock. Frequency is obtained by dividing event counter difference $\Delta$ count E by the time base clock $T_o$ times the corresponding timebase counter difference $\Delta$ count T. That is, Frequency as measured between latch commands = $\Delta$ count E/$T_o$ $\Delta$ count T.

BRIEF DESCRIPTION OF THE DRAWINGS

FIG. 1A shows a functional block diagram of the invention.

DETAILED DESCRIPTION

Figure 1B:
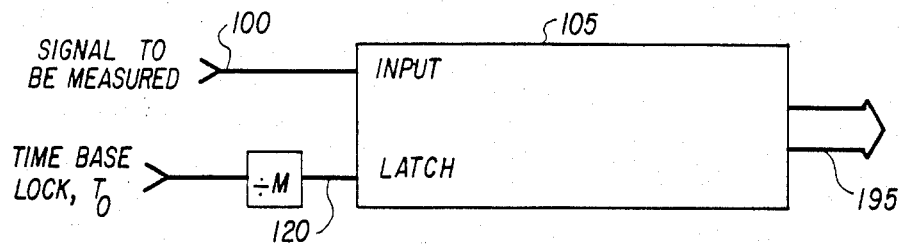
FIGS. 1B and 1C show a conventional and a reciprocal frequency measurement scheme using the preferred embodiment of FIG. 1A.
Figure 1C:
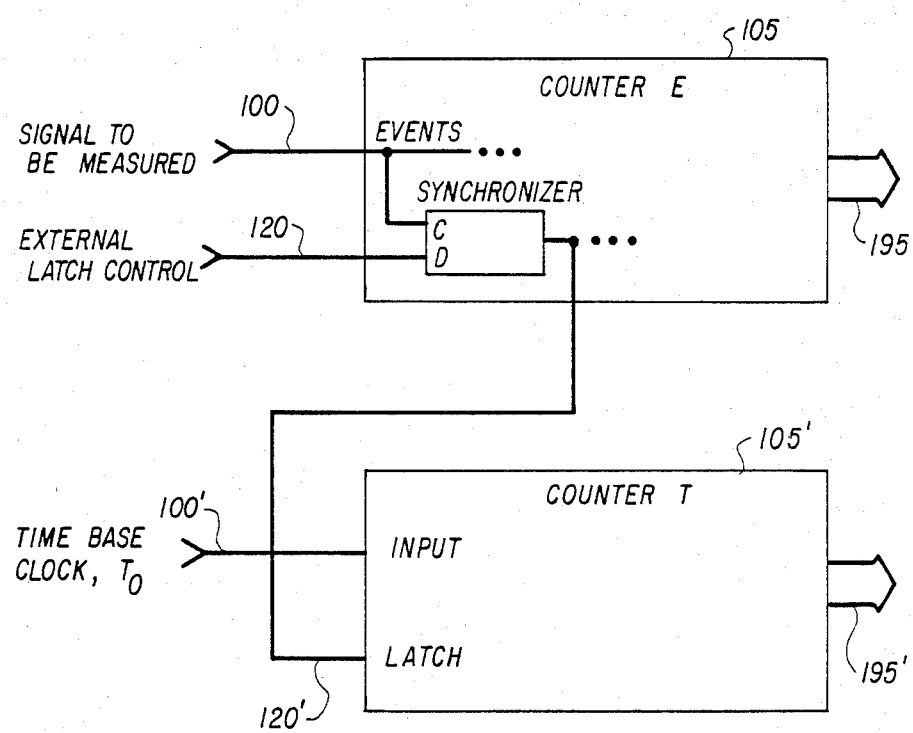

In the preferred embodiment of the invention of FIG. 1A, an input port 100 to a high and low-order counter chain 110, 160 accepts a signal representing events for counting. A parallel input port 120 receives a latching command to indicate the appropriate instant to capture the contents of the counter chain 110, 160. The counter chain 110, 160 comprises a fast counter 110 followed by a slow counter 160. Each of the counters 110, 160 is coupled to a storage device 150, 170 to which the latching command is coupled for response. A synchronizing circuit 130 is used to synchronize occurrence of the events and the latching command. After a slight delay by a delay circuit 140, the output from the synchronizer circuit 130 is used to indicate a latch at the storage devices 150, 170. The latch command to the storage device 170 for the slow counter 160 is further delayed by an inhibit circuit 180 to ensure that a latch occurs only after a predetermined delay following an event. This predetermined delay ensures that carry bits are not in transition upon capture of data, thus preventing bit transition errors or ambiguities from occurring.

Figure 2:
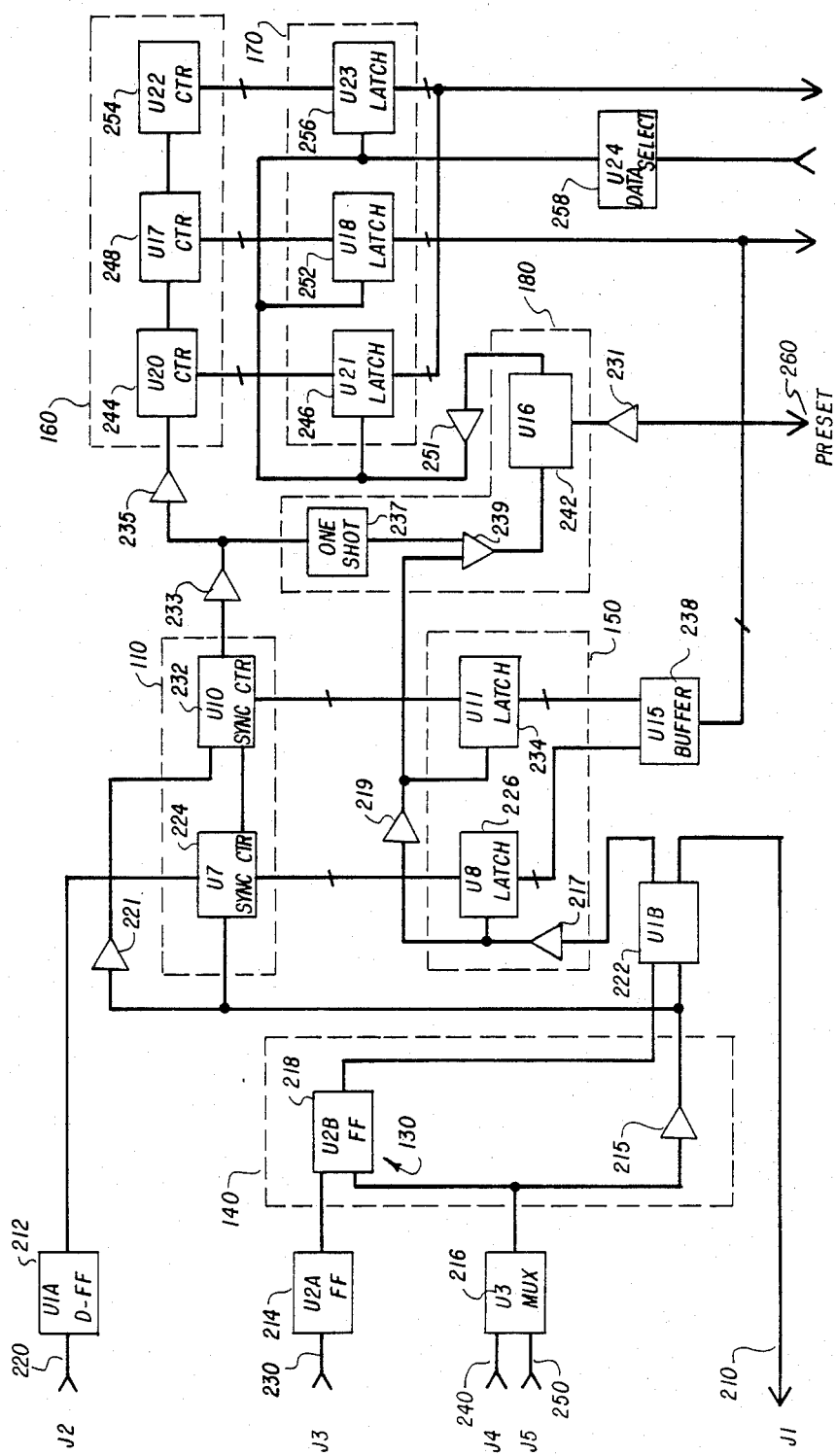
FIG. 2 shows a schematic of a preferred embodiment of the invention.

For greater detail, the operation of the illustrated embodiment is now exemplified. References are made to both FIGS. 1A and 2.

Upon system initiation and after each data capture, flip flops 212, 214, 218 connected to input ports 220, 230, 240 are all reset. When it is desired to latch current data, the positive edge of a latch signal at the latching input port 230 sets the flip-flop 214 connected thereto. The output of this flip-flop 214 is coupled to the input port of another flip-flop 218, a synchronizer flip-flop in the synchronizer circuit 130. This synchronizer flip-flop 218 is set with a next positive-going edge of a clock input at the clock input port 240.

To guarantee that any transient outputs from the synchronizer flip-flop 218 will not affect the flip-flop 222 connected to it 218, the clock pulse on a line 217 to both flip-flops 218, 222 is delayed by a gate 215 preceding flip-flop 222 by, for example, approximately 7 nanoseconds. In this way, transients such as those caused by a clocking pulse and a logic level change occurring simultaneously, that is, when setup or hold time requirement is not met, will not be applied to the ensuing latching circuits 226, 234.

The delayed clock signal is also coupled to synchronous counters 224, 232 in the fast count chain 110. A synchronized latching signal from the synchronizer flip-flop 218, delayed by its propagation through a series of devices 222, 217, 219, arrives at latching devices 226, 234 after the outputs of the synchronous counters 224, 232 have settled and the setup time requirements of the latching devices 226, 234 have been met. To compensate for synchronous carry-bit propagation delays, further delay to the latching signal is implemented with a gating device 219; the clock signal to the synchronous counter 232 is also delayed by a gating device 221 to correspond to the delayed latching signal.

The most significant bit (MSB) from the synchronous counter 232 is coupled to a slow counter chain 160 comprising, for example, ripple-through counters 244, 248, 254. This same MSB signal also triggers a one-shot monostable multivibrator circuit 237. The output signal of the one-shot circuit is combined with the delayed latching signal at a gating device 239. In this way, the propagation of the latching signal is inhibited for the duration of the one-shot circuit 237, which by design is long enough to prevent latching of the counter output data until all carry bits have rippled through all the bits of the slow, possibly asynchronous, counter 160. This inhibition occurs only when data capture is desired and a carry bit is propagating from the synchronous counter 110 to the asynchronous counter 160.

For convenience, the latching signal is synchronized with the clock signal at devices 218 and 222 to provide an actual data-storage latching signal at an output port 210 to drive external circuitry like multiple channels and oscilloscopes.

We claim:

1. An N-bit counting apparatus comprising:

an M-bit low-order synchronous counter;

an (N-M)-bit high-order counter coupled to said synchronous counter in tandem;

first storage means coupled to said synchronous counter for capturing the contents of said synchronous counter;

second storage means coupled to said high-order counter for capturing the contents of said high-order counter; and delay means coupled to said second storage means to prevent capturing for a predetermined period in response to the most significant bit from said synchronous counter.

2. The counting apparatus as in claim 1, wherein said first and second storage means are first and second latching devices, respectively, responsive to applied latching signals.

3. The counting apparatus as in claim 1, wherein said high-order counter is a ripple-through asynchronous counter.

4. The counting apparatus as in claim 1, wherein said counters are binary-coded counters.

5. The counting apparatus as in claim 2, further comprising a synchronization means for causing said first latching device to operate coherently in response to a next countable event applied thereto.

6. The counter apparatus as in claim 2, wherein said delay means comprises:

a monostable multivibrator coupled to said synchronous counter and responsive to the most significant digit of said synchronous counter to provide an output signal; and a gating device coupled to said monostable multivibrator output signal and to a latching signal to provide a further latching signal to said second storage means.

7. The counter apparatus as in claim 3, wherein said delay means comprises:

a monostable multivibrator coupled to said synchronous counter and responsive to the most significant digit of said synchronous counter to provide an output signal; and a gating device coupled to said output signal and to a latching signal to provide a further latching signal to said second storage means.

* * * * *